United States Patent [19]

Birrittella et al.

[11] Patent Number: 4,663,831

[45] Date of Patent: May 12, 1987

[54] METHOD OF FORMING TRANSISTORS WITH POLY-SIDEWALL CONTACTS UTILIZING DEPOSITION OF POLYCRYSTALLINE AND INSULATING LAYERS COMBINED WITH SELECTIVE ETCHING AND OXIDATION OF SAID LAYERS

[75] Inventors: Mark S. Birrittella, Phoenix; Hang M. Liaw; Robert H. Reuss, both of Scottsdale, all of Ariz.

[73] Assignee: Motorola, Inc., Schaumburg, Ill.

[21] Appl. No.: 785,640

[22] Filed: Oct. 8, 1985

[51] Int. Cl.⁴ .............. H01L 21/20; H01L 21/76
[52] U.S. Cl. .............................. 29/576 E; 29/576 W; 148/174; 148/175; 148/DIG. 11; 148/DIG. 20; 148/DIG. 26; 148/DIG. 50; 148/DIG. 117; 148/DIG. 164; 156/643; 156/653; 156/657; 357/34; 357/35; 357/50; 357/59; 357/71
[58] Field of Search ............. 148/174, 175, DIG. 11, 148/DIG. 20, DIG. 26, DIG. 50, DIG. 117, DIG. 164; 29/576 E, 576 W; 357/34, 35, 50, 59, 71; 156/643, 653, 657

[56] References Cited

U.S. PATENT DOCUMENTS

| | | | |
|---|---|---|---|
| 3,519,901 | 7/1970 | Bean et al. | 148/DIG. 124 |
| 4,127,931 | 12/1978 | Shiba | 148/DIG. 117 |
| 4,339,767 | 7/1982 | Horng et al. | 357/59 |
| 4,381,201 | 4/1983 | Sakurai | 148/DIG. 123 |
| 4,400,411 | 8/1983 | Yuan et al. | 148/DIG. 26 |
| 4,569,700 | 2/1986 | Toyama | 148/175 |

FOREIGN PATENT DOCUMENTS 59-126671  7/1984  Japan.

OTHER PUBLICATIONS

D. D. Tang et al., "A Symmetrical Bipolar Structure", IEEE Electron Devices Meeting, Dec. 8-10, 1980, pp. 58-60.
C. Cohen, "Upwardly Operating Bipolar Transistors Increase Efficiency", *Electronics*, Sep. 22, 1982, pp. 85-86.
T. Nakamura et al., "Self-aligned Transistor with Sidewall Base Electrode", *IEEE International Solid-State Circuit Conference*, 2/20/81, pp. 214-215.
T. Nakamura et al., "Self-Aligned Transistor with Sidewall Base Electrode", *IEEE Trans. on Electron Devices*, vol. ED-29, No. 4, Apr. 1982, pp. 596-600.
T. Nakamura et al., "High Speed ITL Circuits Using a Sidewall Base Contact Structure," *IEEE Jour. of Solid-State Circuits*, vol. SC-20, No. 1, Feb. 1985, pp. 168-172.
Arienzo et al., "Simple Technique to Make Symmetrical Transistors" *I.B.M. Tech. Discl. Bull.*, vol. 27, No. 4B, Sep. 1984, pp. 2371-2373.

Primary Examiner—William G. Saba
Attorney, Agent, or Firm—Robert M. Handy

[57] ABSTRACT

Improved bipolar transistors having minimum base-collector and collector-substrate junction area are formed by using multiple polycrystalline (e.g. doped poly silicon) layers to make lateral contact to a pillar shaped single crystal device region. The lateral poly silicon contacts are isolated from each other and the substrate and extend to the upper surface of the device for external connections. The structure is made by depositing two dielectric-poly layer sandwiches, etching and oxidizing part of the poly silicon layers to provide isolated overlapping poly silicon regions, etching a first hole through both poly silicon regions to the substrate, etching a second hole to the lower poly silicon layer, and filling the first and second holes with single and polycrystalline silicon, respectfully. A sidewall oxide is formed at the periphery of the top of the single crystal pillar for defining the emitter location without additional masking.

9 Claims, 20 Drawing Figures

METHOD OF FORMING TRANSISTORS WITH POLY-SIDEWALL CONTACTS UTILIZING DEPOSITION OF POLYCRYSTALLINE AND INSULATING LAYERS COMBINED WITH SELECTIVE ETCHING AND OXIDATION OF SAID LAYERS

BACKGROUND OF THE INVENTION

1. Field of the Invention

This invention relates in general to electronic devices and, more particularly, to improved means and methods for providing small high performance devices with sidewall contacts, suitable for use in large scale integrated circuits.

2. Background Art

There is an ongoing desire in the semiconductor art to produce transistors having smaller and smaller dimensions. This is because, in many applications, more complex circuits, faster performance and lower power dissipation can be obtained with smaller devices. It is generally also desired that the individual devices be electrically isolated one from the other.

With high speed low power bipolar transistors and integrated circuits, for example, the individual devices are usually isolated by a combination of junction isolation and oxide filled trenches etched into the semiconductor substrate. Typically, metallic interconnects are made to emitter, base, and collector contact regions on the upper surface of the active portions of the device. Minimum device size is usually limited by the minimum lithographic dimensions which can be obtained and alignment tolerance among the successive mask layers.

While the available device structures and methods permit very complex integrated circuits to be fabricated, they still suffer from a number of significant limitations. For example, in a typical planar bipolar transistor the base-collector junction area and the collector-substrate junction area are larger than is necessary merely for the desired transistor action because of the need to provide room on the upper surface of the device for the contact regions. These larger than desired junction areas can introduce unwanted parasitic capacitance which limits the device or circuit performance. The larger area also reduces the attainable packing density and circuit complexity.

A partial solution to this problem has been suggested in the prior art by use of "pillar" transistors employing lateral polycrystalline silicon base contacts. However, these prior art structures still suffer from excessive collector-substrate capacitance. Thus, a need continues to exist for device structures and fabrication methods which overcome or avoid one or more limitations of the prior art.

Accordingly, it is an object of the present invention to provide improved means and methods for fabricating minimum geometry semiconductor devices which have reduced base-collector and collector-substrate junction areas.

It is an additional object of the present invention to provide improved means and methods for forming transistors in which electrical connections to the buried active device regions are made laterally.

It is a further object of the present invention to provide improved means and methods for forming bipolar transistors using buried sidewall contacts to the buried device regions.

It is additional object of the present invention to provide improved means and methods for providing device structures which can be individually isolated.

It is a further objective of the present invention to provide symmetrical bipolar devices wherein collector and emitter functions may be readily interchanged, i.e. have similar characteristics in either collector up or collector down operation.

As used herein, the words "polycrystalline" or "poly" are intended to include all non-single crystal forms of solids. As used herein, the words "dip etching" are intended to include all forms of blanket etching or erosion, and are not intended to be limited merely to wet chemical etching.

SUMMARY OF THE NVENTION

The attainment of the foregoing and other objects and advantages is achieved through the present invention wherein there is provided a single crystal substrate, a pillar of single crystal semiconductor material having a lower surface resting on the substrate, an upper surface away from the substrate, and a sidewall therebetween, and having first and second device regions extending laterally through the single crystal pillar to the sidewall. A first polycrystalline conductor region which is electrically isolated from the substrate is provided for contacting the first device region of the single crystal pillar at the sidewall and having an extension to the upper surface of the device. A second polycrystalline conductor region which is electrically isolated from the substrate and from the first polycrystalline conductor region contacts the second device region of the single crystal pillar at the sidewall. Another dielectric layer which optionally extends onto the upper surface of the single crystal pillar is provided over the second polycrystalline conductor region. This dielectric layer has an opening over the central portion of the upper surface of the pillar, an opening over part of the second polycrystalline conductor region, and an opening over the extension of the first polycrystalline conductor region reaching the upper surface of the device. Electrical connections to the device are provided through these openings.

The foregoing and other objects and advantages are further achieved through the present invention wherein there is provided a process for fabricating semiconductor devices comprising, providing a single crystal substrate, providing above the substrate a first polycrystalline conductor region which is electrically isolated from the substrate, providing above the substrate a second polycrystalline conductor region which is isolated from the substrate and from the first polycrystalline conductor region and which has a first portion overlapping a first portion of the first polycrystalline conductor region. A first opening is formed through at least part of the first portions of the overlapping first and second polycrystalline conductor regions and any intervening dielectric layers, which opening penetrates to the substrate. A second opening laterally separated from the second polycrystalline conductor region is provided penetrating through the dielectric layers providing the isolation between the two polycrystalline conductor regions, to the first polycrystalline conductor region. A portion of the first opening is filled with a single crystal semiconductor material which contacts the edges of both the first and second polycrystalline conductor regions exposed in the first opening. A portion of the second opening is filled with a polycrystalline conductor material contacting the first polycrystalline conductor region. These filled portions extend near the upper surface of the device. An overlying dielectric layer is provided and contact holes formed therein to permit electrical connections to be made to the single crystal semiconductor material and the polycrystalline conductor regions. For an NPN bipolar transistor, it is convenient that the substrate be P-doped, that the first polycrystalline conductor region be an N+ doped polycrystalline conductor, to form a side-wall connection to the N-type collector portion of the device structure, and that the second polycrystalline conductor layer be a P+ doped polycrystalline conductor for forming the side-wall contact to the P-type base region of the device. A single masking layer is used to define the location and size of the first and second openings. The lateral dimensions of the first and second polycrystalline conductor layers are preferably defined by masking them with an oxidation resistant mask, and then converting the exposed portions to a dielectric oxide, which dielectric oxide provides electrical isolation between the successive conductive layers.

DETAILED DESCRIPTION OF THE DRAWINGS

Figure 1A:
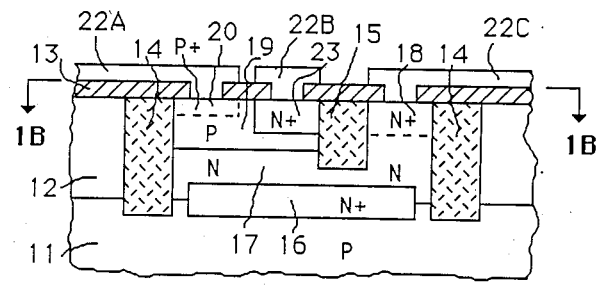
FIGS. 1A-C show simplified schematic cross-sectional side and plan views of a portion of a semiconductor device accordingly to the prior art.
Figure 1B:
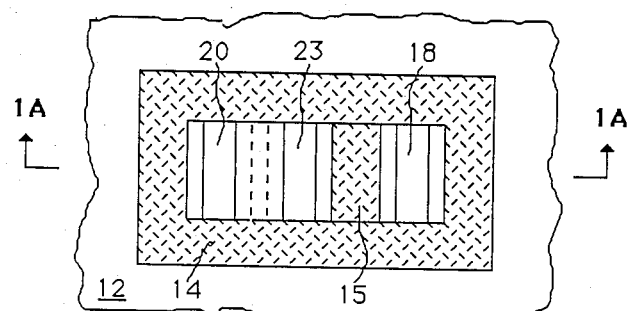

For the purposes of explanation, the device structures illustrated herein are shown as bipolar devices having particular combinations of N and P layers. However, those of skill in the art will understand that these device structures and doped layer combinations are presented merely as an aid to understanding and are not intended to be limiting, and that other combinations of N and P layers or regions and other device types can equally well be used and fabricated according to the teachings of the present invention. FIGS. 1A-B show in schematic form simplified cross-sectional side and plan views of a portion of a typical semiconductor device made according to the prior art. Semiconductor device portion 10 consists of P-type substrate 11 covered by epitaxial layer 12 and having buried N+ region 16, N-type collector region 17, P-type base region 19, N+ emitter region 23, N+ collector contact region 18, P+ base contact region 20 and dielectric layer 13. Dielectric layer 13 is transparent in FIG. 1B. Device portion 10 is surrounded by dielectric isolation walls 14. Collector contact region 18 is separated from emitter 23 by additional dielectric isolation wall 15. Electrical contacts 22a, 22b, and 22c are provided respectively, to base contact region 20, emitter region 23, and collector contact region 18. Means for constructing such devices are well known in the art.

Figure 1C:
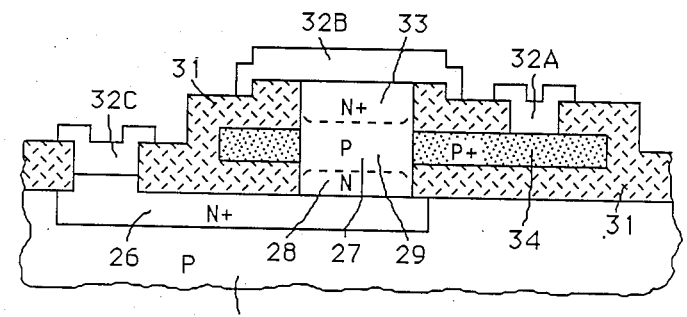

FIG. 1C shows a simplified schematic cross-sectional side view of another bipolar device structure known in the prior art. Device portion 30 consists of single crystal substrate 21 in which has been placed buried collector region 26. Dielectric layer 31 surrounds pillar-like single crystal device region 27 consisting of collector portion 28, base portion 29, and emitter portion 33. In contrast to the structure of device 10 of FIG. 1A, base portion 29 of device 30 of FIG. 1C does not extend directly to the upper surface of device 30. Rather, contact to base portion 29 is made by means of P+ polycrystalline silicon layer 34 which contacts base portion 29 of single crystal device region 27 at its lateral periphery. Electrical contacts to device 30 are provided by metal 32a which contacts poly region 34, metal 32b which contacts emitter 33, and metal 32c which contacts buried collector region 26.

A deficiency of the structure of FIG. 1A is that extending the active base and collector regions to the upper surface increases the base-collector junction and the collector-substrate junction area. The structure of FIG. 1C provides some improvement since no additional base-collector junction area is needed to accommodate the base contact. However, the structure of FIG. 1C does not substantially reduce the collector-substrate junction area. Among other things, this can degrade the device performance and increase device size.

These and other problems are overcome by the structure of FIGS. 2A-D, according to the present invention. FIGS. 2A-D show simplified schematic cross-sections of NPN device portion 40 comprising substrate 41 with superposed dielectric regions 42-46. Silicon oxide, silicon nitride, or combinations thereof are suitable materials for dielectric regions 42-46. Other dielectrics capable of withstanding the processing used to form pillar 49 can also be used. Penetrating through dielectric regions 42-46 is single crystal semiconductor pillar 49 in which has been formed N+ buried collector 49a, N-type collector region 49b P-type base region 49c, and N+ emitter region 49d. Electrical contacts to collector region 49a-b and base region 49c are made laterally at the periphery of single crystal pillar 49 by poly regions 47a-b and 48a-b respectfully. Collector contact region 47a-b consists of comparatively thin lateral contact portion 47a and pillar region 47b. Pillar 47b connects lateral contact portion 47a to external contact 50c. Poly base contact region 48a-b consists of comparatively thin lateral contact portion 48a and optional vertical contact portion 48b extending to external base contact 50a. Portion 48b may optionally be of metal (e.g. see FIG. 3J). External contact 50b contacts N+ emitter region 49d of single crystal region 49. Poly regions 47a-b and 48a-b are conveniently of polycrystalline silicon however other conductors able to make appropriate contact to single crystal pillar 49 and able to withstand the processing necessary to form the pillars, the dielectrics, and the conductor layers can also be used. Silicides, intermetallics and metals are useful. It is convenient if they readily form stable dielectric oxides, such as for regions 43 and 45.

Figure 2A:
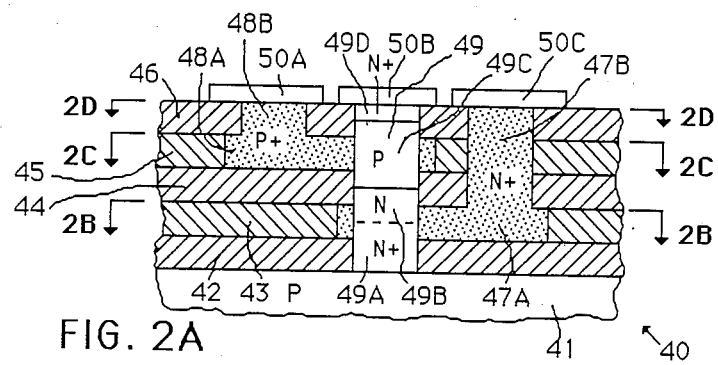
FIGS. 2A-D show simplified schematic cross-sectional side and plan views of a portion of a semiconductor device according to the present invention.
Figure 2B:
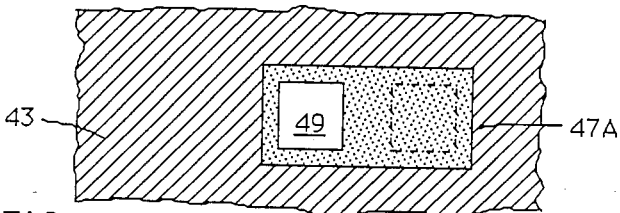
Figure 2C:
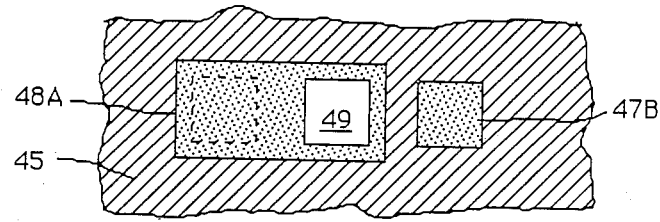
Figure 2D:
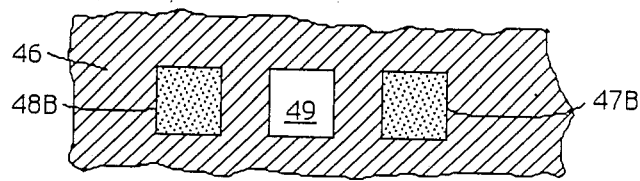

FIGS. 2B-D show, in simplified schematic form, planar cross-sectional views through the structure of FIG. 2A at different levels within the structure. For ease of understanding in FIGS. 2B-D, single crystal regions are shown as clear, dielectric regions are hatched, and polycrystalline conductor regions are shown stippled. In FIGS. 2B-C the locations of column portions 47b and 48b above lateral contact portions 47a and 48a are shown by dashed lines.

The structure of FIGS. 2A–D has reduced base-collector junction area and reduced collector-substrate junction area because single crystal active device region 49 need only be large enough to provide the necessary drive current, and need not have additional area to accommodate planar contacts, since both base and collector contacts are made laterally by layers 48a–b and 47a–b. Polycrystalline contact 47a–b is isolated from substrate 41 by dielectric region 42. Polycrystalline contact 48a–b is isolated from poly region 47a–b and substrate 41 by dielectric regions 42–45. This combination of structural features reduces the parasitic capacitance associated with the device and therefore permits improved performance with smaller device area. The device of FIGS. 2A–D is inherently self-isolating, i.e., no special isolation walls such as 14, 15 of FIG. 1 need be provided.

Figure 3A:
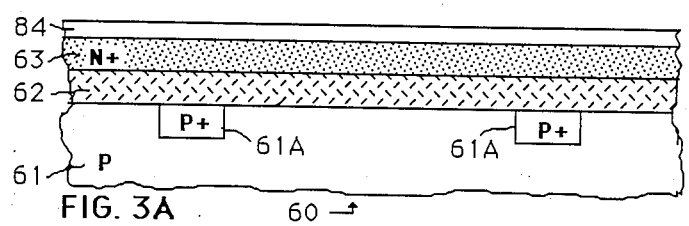
FIGS. 3A-J show simplified schematic cross-sectional views of a portion of a semiconductor device according to the present invention at different stages of fabrication.

FIGS. 3A–I show cross-sectional views in simplified schematic form, but in greater detail, of the device of FIGS. 2A–D at different stages of fabrication, according to a preferred embodiment. The fabrication sequence is shown for the case of an NPN transistor. As shown in FIG. 3A, device portion 60 comprises P-type substrate 61 having therein P+ channel-stop regions 61a. Channel-stop regions 61a are convenient but not essential to the present invention. Substrate 61 is covered by dielectric layer 62, N+ polycrystalline conductor layer 63, and mask layer 84. Channel stop regions 61a, dielectric layer 62, polycrystalline layer 63, and mask layer 84 are formed by means well known in the art. Where layer 63 is a semiconductor, e.g. polysilicon, it is conveniently doped, for example N+ where an NPN device is being formed.

Figure 3B:
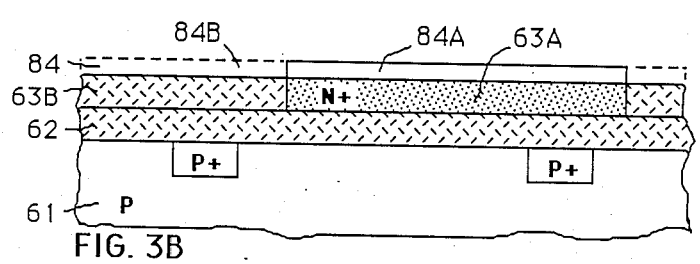

Mask layer 84 is patterned to provide protective portion 84a and open portion 84b (FIG. 3B). It is desirable that mask layer 84 be resistant to etching and oxidation, since this permits the exposed portions of polycrystalline layer 63 to be converted to dielectric region 63b leaving polycrystalline region 63a substantially undisturbed. This is conveniently accomplished by first etching away approximately 30–60% of the thickness of the exposed polysilicon, then using an oxygen containing gas at high temperature to convert it to oxide region 63b. This is desirable because the oxide occupies more space than the poly and hence should be removed if it is desired that the upper surfaces of regions 63a and 63b remain approximately co-planar. Other methods for obtaining dielectric region 63b and polycrystalline region 63a can also be used.

Figure 3C:
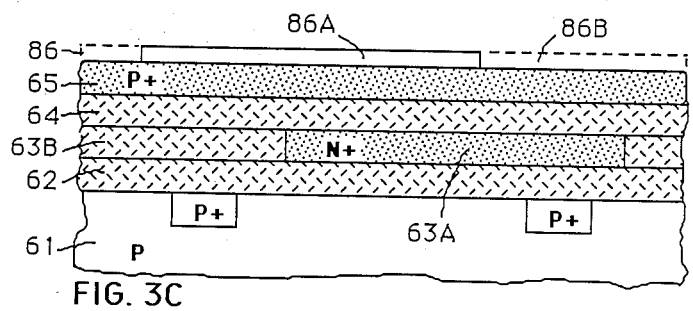
Figure 3D:
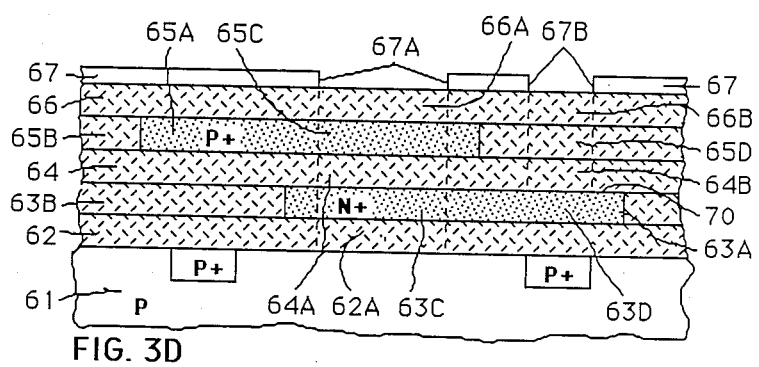

Mask 84a is then removed, and the structure covered by dielectric layer 64, polycrystalline conductor layer 65 and mask layer 86. Where polysilicon is used for layer 65 it is conveniently doped P+. Mask layer 86 is exposed and patterned to provide protective portion 86a and open portion 86b (FIG. 3C). Using mask 86a, in a fashion similar to that employed in connection with mask 84a, polycrystalline layer 65 is partially converted to dielectric regions 65b, leaving substantially undisturbed polycrystalline portion 65a (FIG. 3D).

After removing mask 86a, the structure is desirably covered by dielectric layer 66 and mask 67 having openings 67a–b. Using openings 67a–b, portions 66a–b of layer 66, 65c–d of layer 65, and 64a–b of layer 64 are removed as shown in FIG. 3D. It is desirable to use an anisotropic etching technique so that the holes created through layers 64–66 under openings 67a–b are relatively straight-sided as indicated in FIG. 3D. This procedure exposes the portion of upper surface 70 of polycrystalline semiconductor regions 63c and 63d beneath openings 67a–b.

Figure 3E:
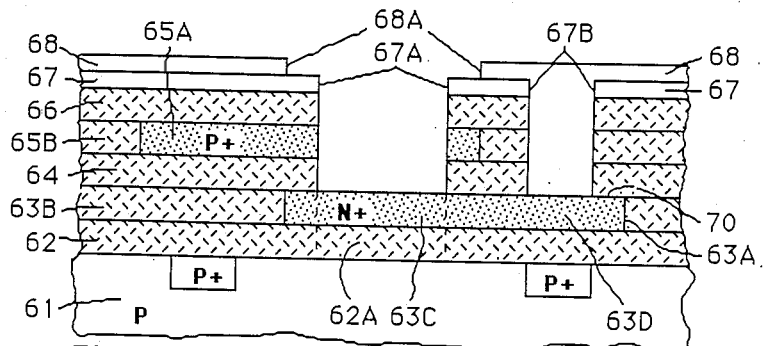
Figure 3F:
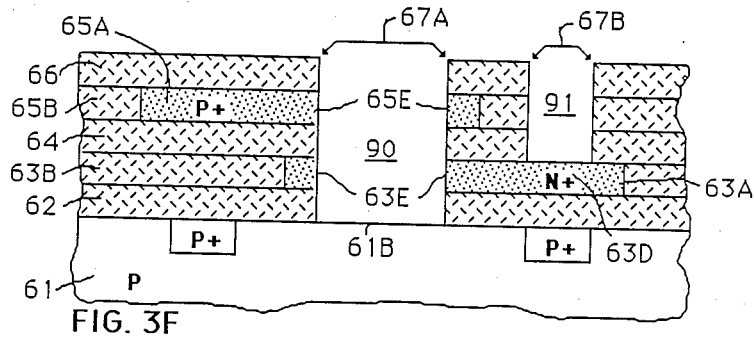

Additional mask layer 68 having opening 68a is then applied (FIG. 3E). Underlying mask layer 67 may be left in place, but this is not essential since openings 67a–b have been replicated in layer 66. Mask 68 must cover opening 67b. Opening 68a of layer may be larger than opening 67a. This is preferred for ease of alignment. Using the combination of openings 68a and 67a, portion 63c of region 63a and portion 62a of layer 62 under opening 67a are removed so as to expose region 61b of substrate 61 under opening 67a (FIG. 3F). Masks 67 and 68 are removed.

The use of mask 68 may be avoided by the following procedure. After mask 67 and openings 67a–b have been formed, layer 66 is etched exposing regions 65c–d under openings 67a–b. A poly selective etch is used to remove region 65c, an oxide selective etch is used to remove regions 64a and 65d, a poly selective etch is used to remove region 63c, and an oxide selective etch is used to remove regions 62a and 64b, under openings 67a–b.

The above described procedures, with or without mask 68, creates hole 90 having substantially the same lateral dimensions as opening 67a extending through layers 62–66 to substrate 61, and hole 91 having substantially the same lateral dimensions as opening 67b extending through layers 64–66 to layer 63 (FIG. 3F). It will be noted that at this stage in the process, lateral edges or sides 63e and 65e of poly layers 63 and 65, and region 61b of substrate 61 are exposed in hole 90, and that portion 63d of layer 63 is exposed at the bottom of hole 91 (FIG. 3F).

Single crystal epitaxial region 72 is then formed on exposed portion 61b of substrate 61 in hole 90. For the particular combination of conductivity types illustrated in FIGS. 3A–J, it is desirable that epitaxial single crystal region 72 have lower N-doped region 72a and upper P-doped region 72b. Single crystal region 72 may completely or partially fill hole 90. It is only necessary that single crystal region 72 fill hole 90 sufficiently to reach lateral P+ poly contact portion 65a. Single crystal epitaxial region 72 is desirably prepared by means of selective epitaxial growth using means well known in the art. Epitaxial growth at a temperature of 925°–1100° C. using a chlorosilane plus HCl mixture with a silicon to chlorine atomic ratio in the range of 0.1 to 0.5 has been found to give satisfactory results. Reduced pressure (less than atmospheric) growth is preferred. The growth time is adjusted to fill hole 90 about to the level of layer 66. Upper P-type region 72b may be provided by either changing the doping type during growth of region 72 or by doping after growth using means well known in the art, such as, for example, ion implantation. As a consequence of the necessary heating cycles accompanying the growth of region 72 and/or its subsequent doping to form P region 72b, region 72c will become more heavily P-doped by outdiffusion from P+ region 65a, and region 72d will become more heavily N doped by of outdiffusion from N+ region 63a, into the comparatively lightly doped material of single crystal region 72. This outdiffusion doping of pillar 72 insures that low resistance ohmic contacts are obtained to base region 72b and collector region 72a. If P-doped region 72b is not provided in a particular pillar, then outdiffusion from P+ region 65a will produce a PN junction contact to N-doped portion 72a of pillar 72 adjacent to poly region 65a. As will be subsequently explaned in connection with FIGS. 4A-B, this variation is useful for forming lateral transistors, e.g., a lateral PNP transistor While hole 90 is being filled with single crystal pillar 72, hole 91 under mask opening 71b is conveniently filled with polycrystalline region or pillar 73. Pillar 73 directly contacts portion 63d of polycrystalline region 63a. Poly region 73 and single crystal region 72 are conveniently formed during the same epitaxial growth operation, although this is not essential. It is well known that polycrystalline semiconductor material will grow from a polycrystalline surface at the same time that single crystal semiconductor material grows from a single crystal surface. It is desirable that during epi and poly growth there is little or no semiconductor deposition on the surface of dielectric layer 66. Means for accomplishing this differentiation are well known in the art.

Figure 3G:
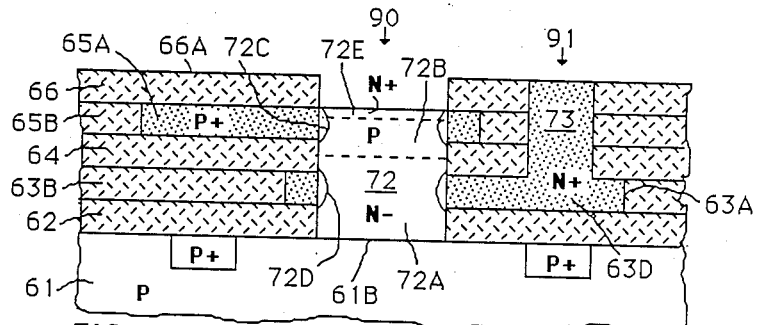

At this point in the process, a bipolar transistor may be formed in single crystal material 72 by adding N+ dopant in region 72d at the top of region 72b (FIG. 3G). However, superior device characteristics are obtained by using the procedure illustrated in FIGS. 3H-I.

Figure 3H:
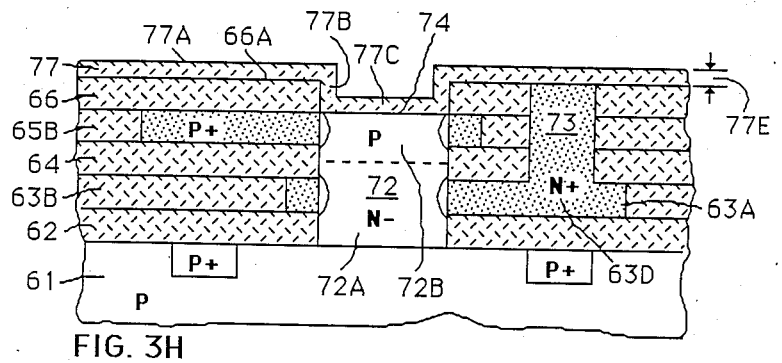

Following the growth of single crystal region 72 and polycrystalline region 73, dielectric layer 77 is deposited over the structure (FIG. 3H). Layer 77 has portion 77c covering upper surface 74 of single crystal region 72, portion 77a covering dielectric film 66, and corner portion 77b following the contour of the step height change between upper surface 66a of layer 66 and upper surface 74 of single crystal region 72. In order that layer 77 follow the surface contour, as illustrated in FIG. 3H, it is important that layer 77 be deposited or formed by a conformal coating method. Silicon oxide, silicon nitride, or combinations thereof are suitable materials for layer 77. Means for producing conformal coatings of such materials are well known in the art.

Figure 3I:
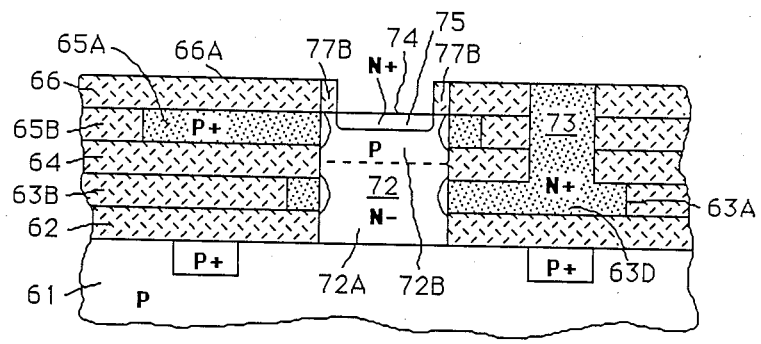

Layer 77 is then anisotropically etched, as for example using reactive ion etching or ion milling (techniques well known in the art), to remove thickness 77e. The anisotropic etching should be arranged so as to etch substantially only vertically and not horizontally. Following this step one obtains the structure shown in FIG. 3I in which corner portions 77b of layer 77 remain above the periphery of single crystal region 72. Corner portions 77b now provide a convenient mask so that N+ region 75 may be placed in the central portion of surface 74 of single crystal region 72, for example by ion implantation. This step is conveniently accomplished without further masking since implantation of N+ impurities into the exposed upper portion of polycrystalline column 73 creates or enhances the desired N+ conductivity type (FIG. 3I). Alternatively poly region or column 73 maybe covered and doped separately.

Hole 92 is then opened in dielectric layer 66 to expose a part of poly region 65a and base connection 78a is applied thereto. Emitter connection 78b is applied to emitter region 75, and collector connection 78c is applied to N+ poly region 73 (FIG. 3I). Connections 78a-c may be of metal or other electrically conductive material, for example, polysilicon.

Figure 3J:
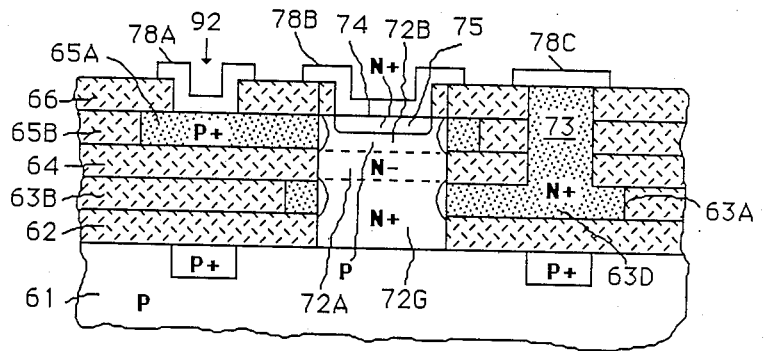

FIG. 3J illustrates a further variation in which N+ region 72g is provided in the lower portion of pillar 72 to reduce collector series resistance. This is conveniently accomplished by using greater N doping concentration during the initial phase of epi growth of pillar 72.

Figure 4A:
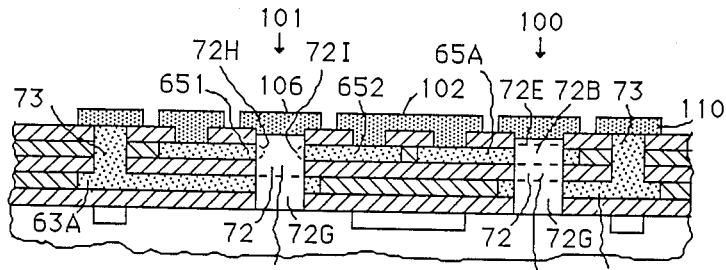
FIGS. 4A-C show simplified schematic cross-sectional view various semiconductor devices and interconnections according to further embodiments of the present invention.
Figure 4B:
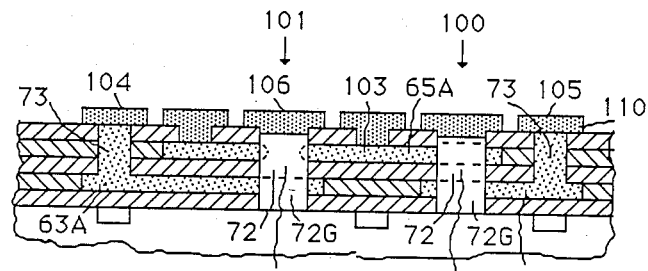
Figure 4C:
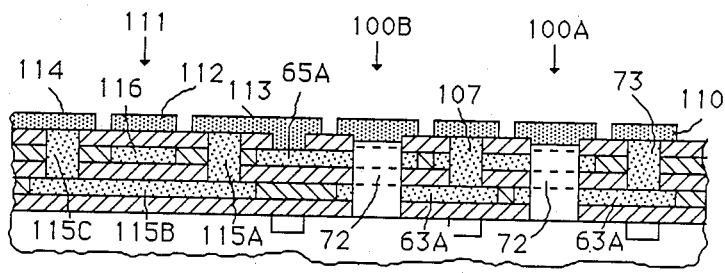

FIGS. 4A-C show simplified schematic cross-sectional views of NPN vertical transistors 100 and PNP lateral transistors 101 according to further embodiments of the present invention. For clarity, single crystal regions are shown clear, buried conductors (e.g. polysilicon) are shown lightly stippled, dielectric regions are shown hatched, and surface conductor regions (e.g. metal) are shown heavily stippled. The layers and regions shown in FIGS. 4A-C correspond generally to those illustrated in FIGS. 3A-J.

Vertical transistors 100 are formed according to the procedure described in connection with FIGS. 3A-J. Single crystal pillar 72 of vertical transistor 100 has N+ regions 72e and 72g, N region 72a, and P region 72b. Either of N+ regions 72e or 72g can serve as the emitter or collector since the structure is geometrically approximately symmetrical. Lateral transistor 101 is formed in another single crystal region 72 by the same procedure except that P region 72b is omitted. Separate P+ poly regions 651 and 652 form P doped regions 72h and 72i in N region 72a of pillar 72 of transistor 101 by out-diffusion. The regions 72h-i serve as the emitter and collector of lateral PNP transistor 101.

FIG. 4A shows devices 100 and 101 as independent isolated devices and FIG. 4B shows the same devices 100 and 101 interconnected by means of buried poly regions 103. This provides a more compact structure while still providing independent contact 105 to buried collector 72g of transistor 100 and independent contact 104 to buried base 72a of transistor 101. Metal region 106 is also available as an independent contact to base region 72a of transistor 101.

FIG. 4C shows a further embodiment of the present invention wherein two vertical transistors 100a-b analagous to transistors 100 of FIGS. 4A-B, are interconnected so that the collector (or emitter) of transistor 100b is internally connected via poly pillar 107 to the base of transistor 100a. This arrangement might be used for example in forming a Darlington. Since one contact serves to make the conection internally a net space saving is achieved as compared to making the same connection on the upper surface.

The left portion of FIG. 4C illustrates how the means and method of the present invention automatically provides buried multilayer interconnections formed at the same time as the sidewall contacts. Portions 113 and 114 of metal layer 110 are interconnected by poly regions 115a-c formed at the same time as poly regions 63a and poly pillars 73 and 107. Buried interconnection portion 116 is formed at the same time as poly region 65a, and surface interconnection portion 111 is formed at the same time as metal layer 110. Thus three levels of interconnections (115a-c, 116, and 111) are automatically obtained at the same time as devices 100a-b are fabricated and without further process steps. This illustrates the great flexibility and power of the invented means and method.

Having thus described the invention it is apparent that the present invention provides a means and method for constructing self-isolated devices on a common semiconductor substrate which have minimum parasitic junction areas, and further have lateral sidewall contacts which are isolated from each other and from the substrate by dielectric regions rather than merely by PN junctions. Separate isolation walls are not required. The described method is particularly suitable for use in high density integrated circuits. Multilayer interconnections are obtained without further process steps.

While the invented means and method have been illustrated in terms of particular combinations of conductivity and device types, those of skill in the art will recognize that these are merely intended to be illustrative, and that the invented means and method can be used in connection with other combinations of conductivity types and other arrangements of PN junctions and lateral contacts. Accordingly, it is intended to include all such variations within the claims which follow.

We claim:

1. A process for forming sidewall contact transistors comprising:
   providing a substrate having on a portion thereof a first dielectric region covered by a first polycrystalline conductor region;
   providing on said first polycrystalline conductor region a first etch and oxidation resistant mask covering a first portion thereof leaving exposed a second portion thereof;
   etching away 30-60 percent of the thickness of said first polycrystalline conductor region in said second portion thereof;
   oxidizing the remainder of said second portion of said polycrystalline conductor region to form a second dielectric region;
   removing said first mask;
   providing a second polycrystalline conductor region above and insulated from said first polycrystalline conductor region by a third dielectric region;
   providing on said second polycrystalline region a second etch and oxidation resistant mask covering a first portion and leaving exposed a second portion thereof, and wherein said first portion of said second polycrystalline conductor region overlies some of said first portion of said first polycrystalline conductor region;
   etching away 30-60 percent of the thickness of said second polycrystalline conductor region in said second portion thereof;
   oxidizing the remainder of said second portion of said second polycrystalline conductor region to form a fourth dielectric region;
   covering said first portion of said second polycrystalline conductor region by a fifth dielectric region having an outer surface;
   removing first superposed parts of said first, third and fifth dielectric regions and said first and second polycrystalline conductor regions to expose a first part of said substrate underlying said first superposed parts;
   removing second superposed parts of said third, fourth, and fifth dielectric regions to expose a second part of said first polycrystalline conductor region; and
   forming a pillar of single crystal semiconductor material on said exposed first part of said substrate and a pillar of polycrystalline conductor material on said exposed second part of said first polycrystalline conductor region, wherein said single crystal pillar contacts said first portions of said first and second polycrystalline conductor regions and has an outer surface lying below said outer surface of said fifth dielectric region, and wherein said outer surface of said single crystal pillar and said outer surface of said fifth dielectric region form a step, and wherein said polycrystalline conductor pillar has an exposed surface.

2. The process of claim 1 further comprising:
   covering said outer surface of said single crystal pillar, said exposed surface of said polycrystalline conductor pillar and said outer surface of said fifth dielectric region with a sixth dielectric region;
   etching said sixth dielectric region to form a dielectric spacer at said step, wherein said dielectric spacer covers a peripheral portion and leaves exposed a central portion of said outer surface of said single crystal semiconductor pillar; and
   doping a near surface part of said single crystal semiconductor pillar with a dopant of a first conductivity type.

3. The process of claim 2 further comprising, prior to said step of doping a near surface part of said single crystal semiconductor pillar with a dopant of a first conductivity type, doping the portion of said single crystal semiconductor pillar which contacts said first portion of said second polycrystalline conductor region with a dopant of a second conductivity type.

4. The process of claim 2 further comprising electrically contacting said first part of said second polycrystalline conductor region, said central portion of said surface of said single crystal region and said exposed surface of said polycrystalline pillar.

5. The process of claim 4 wherein said electrically contacting step comprises first exposing a first part of said first portion of said second polycrystalline region after said step of removing second superposed parts of said third, forth, and fifth dielectric layers.

6. The process of claim 4 wherein said electrically contacting step comprises contacting with a third polycrystalline region.

7. The process of claim 6 wherein said electrically contacting step is performed prior to said step of doping said single crystal pillar with a dopant of said first type, and wherein the portion of said polycrystalline region above said central portion of said outer surface of said single crystal pillar is of said first conductivity type and acts as a diffusion source for said step of doping said single crystal pillar with said first conductivity type dopant.

8. A process for forming semiconductor devices comprising:
   providing s single crystal substrate;
   providing a first dielectric layer on said substrate;
   providing a first oxidizable conductor layer on said first dielectric layer, having thereon a first oxidation resistant mask covering a first region thereof and exposing a second region thereof, and etching away 30-60 percent of the thickness of said second region thereof, leaving behind a first remainder, and oxidizing said first remainder to replace said second region with a first oxide;
   providing a second dielectric layer above said first region of said first conductor;
   providing a second oxidizable conductor layer at least on said second dielectric layer, having thereon a second oxidation resistant mask covering a first region thereof and exposing a second region thereof, and etching away 30-60 percent of the thickness of said second region thereof, leaving behind a second remainder, and oxidizing said second remainder to replace said second region with a second oxide;
   wherein said first region of said second conductor layer has a first portion overlapping a first portion of said first region of said first conductor layer;

forming a first opening through at least part of said first portions of said first and second conductor regions penetrating to said substrate;

forming a second opening laterally separated from said second conductor region and penetrating to said first conductor region;

filling a portion of said first opening with single crystal semiconductor material which contacts both said first and second conductor regions in said first opening;

filling a portion of said second opening with polycrystalline material which contacts said first conductor region;

introducing a first dopant into an upper part of said single crystal semiconductor material to a first depth;

forming sidewall spacers at the lateral sides of said first opening and at the surface of said upper part of said single crystal semiconductor material and then introducing a second dopant into said upper part of said single crystal semiconductor material in a region between said sidewall spacers to a second depth less than said first depth; and forming electrical connections to said single crystal semiconductor material, said conductor material in said second opening, and said second polycrystalline region.

9. The process of claim 8 wherein said second conductor region is covered by a dielectric masking layer having an outer surface and said first filling step comprises filling said first opening to a level below the level of said outer surface of said dielectric masking layer at said opening to create a surface height step between the outer surface of said single crystal semiconductor material and the outer surface of said dielectric masking layer, and wherein said process step of forming said sidewall oxide spacers comprises the process steps of conformally covering said outer surface of said dielectric masking layer and the outer surface of said single crystal semiconductor material with another dielectric masking layer having a first vertical thickness above said outer surface of said dielectric masking layer but greater vertical thickness at said surface height step, and then anisotropically removing said first thickness of said another dielectric masking layer.

* * * * *